United States Patent
Xie et al.

(10) Patent No.: US 10,388,747 B1
(45) Date of Patent: Aug. 20, 2019

(54) GATE CONTACT STRUCTURE POSITIONED ABOVE AN ACTIVE REGION WITH AIR GAPS POSITIONED ADJACENT THE GATE STRUCTURE

(71) Applicant: GLOBALFOUNDRIES Inc., Grand Cayman (KY)

(72) Inventors: Ruilong Xie, Niskayuna, NY (US); Christopher M. Prindle, Poughkeepsie, NY (US); Emilie Bourjot, Cohoes, NY (US); Laertis Economikos, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/938,510

(22) Filed: Mar. 28, 2018

(51) Int. Cl.
| *H01L 29/423* | (2006.01) |
| *H01L 29/06* | (2006.01) |
| *H01L 29/66* | (2006.01) |
| *H01L 23/535* | (2006.01) |
| *H01L 21/764* | (2006.01) |

(52) U.S. Cl.
CPC ...... *H01L 29/42376* (2013.01); *H01L 21/764* (2013.01); *H01L 23/535* (2013.01); *H01L 29/0649* (2013.01); *H01L 29/6653* (2013.01); *H01L 29/6656* (2013.01); *H01L 29/66545* (2013.01)

(58) Field of Classification Search
CPC ........... H01L 29/42376; H01L 29/6656; H01L 29/6653; H01L 29/66545; H01L 23/535; H01L 29/0649; H01L 21/764
USPC ...................................................... 257/401
See application file for complete search history.

(56) References Cited

U.S. PATENT DOCUMENTS

| 5,891,783 | A | * | 4/1999 | Lin ................... H01L 21/28114 257/E21.205 |
| 5,915,182 | A | | 6/1999 | Wu |
| 6,297,109 | B1 | | 10/2001 | Chan et al. |
| 6,596,599 | B1 | | 7/2003 | Guo |
| 7,741,663 | B2 | | 6/2010 | Hause et al. |
| 8,124,531 | B2 | | 2/2012 | Chandrashekar et al. |
| 8,183,627 | B2 | | 5/2012 | Currie |
| 8,637,930 | B2 | | 1/2014 | Ando et al. |

(Continued)

OTHER PUBLICATIONS

U.S. Appl. No. 15/672,336 entitled "Field Effect Transistor Having an Air-Gap Gate Sidewall Spacer and Method".

(Continued)

*Primary Examiner* — Caleen O Sullivan
(74) *Attorney, Agent, or Firm* — Amerson Law Firm, PLLC

(57) ABSTRACT

One illustrative integrated circuit product disclosed herein includes a transistor device comprising a T-shaped gate structure positioned above an active region defined in a semiconducting substrate, the T-shaped portion of the gate structure comprising a relatively wider upper portion and a relatively narrower lower portion, and first and second conductive source/drain structures positioned adjacent opposite sidewalls of the T-shaped gate structure. In this example, the product also includes first and second air gaps positioned adjacent opposite sidewall of the T-shaped gate structure, wherein each of the air gaps is positioned between at least the lower portion of one of the sidewalls of the T-shaped gate structure and the adjacent conductive source/drain structure.

20 Claims, 16 Drawing Sheets

(56) References Cited

U.S. PATENT DOCUMENTS

| | | | |
|---|---|---|---|
| 9,252,233 | B2 | 2/2016 | Hsiao et al. |
| 9,362,355 | B1 | 6/2016 | Cheng et al. |
| 2007/0184615 | A1 | 8/2007 | Brazzelli et al. |
| 2010/0055904 | A1 | 3/2010 | Chen et al. |
| 2010/0102363 | A1 | 4/2010 | Hause et al. |
| 2012/0104512 | A1 | 5/2012 | Horak et al. |
| 2012/0129301 | A1 | 5/2012 | Or-Bach et al. |
| 2013/0093019 | A1 | 4/2013 | Ando et al. |
| 2013/0307032 | A1 | 11/2013 | Kamineni et al. |
| 2013/0334587 | A1 | 12/2013 | Purayath et al. |
| 2014/0077305 | A1 | 3/2014 | Pethe et al. |
| 2015/0214113 | A1 | 7/2015 | Bouche et al. |
| 2015/0243544 | A1 | 8/2015 | Alptekin et al. |
| 2016/0111515 | A1 | 4/2016 | Besser et al. |
| 2018/0138279 | A1 | 5/2018 | Xie et al. |

OTHER PUBLICATIONS

Benoit et al., "Interest of SiCO Low k=4.5 Spacer Deposited at Low Temperature (400° C) in the perspective of 3D VLSI Integration," IEEE, 2015, pp. 8.6.1-8.6.4.

* cited by examiner

GATE CONTACT STRUCTURE POSITIONED ABOVE AN ACTIVE REGION WITH AIR GAPS POSITIONED ADJACENT THE GATE STRUCTURE

BACKGROUND OF THE INVENTION

1. Field of the Invention

The present disclosure generally relates to the fabrication of integrated circuits, and, more particularly, to various embodiments of a gate contact structure positioned above an active region of a transistor device with air gaps positioned adjacent the gate structure and methods of making such a structure.

2. Description of the Related Art

Typically, due to the large number of semiconductor devices (i.e., circuit elements such as transistors, resistors, capacitors, etc.) and the required complex layout of modern integrated circuits, the electrical connections or "wiring arrangement" for the individual semiconductor devices, e.g., transistors, capacitors, etc., cannot be established within the same device level on which the semiconductor devices are manufactured. Accordingly, the various electrical connections that constitute the overall wiring pattern for the IC product are formed in a metallization system that comprises a plurality of stacked "metallization layers" that are formed above the device level of the product.

In order to function properly, for a typical transistor, separate conductive electrical paths are formed for the conductive gate structure, the source region and the drain region of the transistor. Part of that process involves forming what are generally referred to as device level contacts, i.e., a plurality of so-called "CA contact" structures for establishing electrical connection to the source/drain regions of the transistor device, and a gate contact structure, which is sometimes referred to as a "CB contact" structure, for establishing electrical connection to the gate structure of the transistor device. The CB gate contact is typically positioned vertically above isolation material that surrounds the transistor device, i.e., the CB gate contact is typically not positioned above the active region, but it may be in some advanced architectures.

The CB gate contact is typically positioned above the isolation region so as to avoid or reduce the chances of creating an electrical short between the CB gate contact and the conductive source/drain structures (e.g., trench silicide (TS) structures) formed in the source/drain regions of the transistor adjacent the gate structure of the transistor. Typically, there are also design rules that set a minimum spacing that must be maintained between the CB gate contact and the conductive source/drain structures in an attempt to prevent such electrical shorts. Unfortunately, there is an area penalty associated with the requirement that the CB gate contact only be positioned above the isolation region. Additionally, insulating material, typically in the form of at least a sidewall spacer, is positioned between the gate structure and the conductive source/drain structures located on opposite sides of the gate structure. The spacer is typically made of silicon nitride which has a relatively high k value of, e.g., about 7-8. As a result of the physical configuration of the transistor, a gate-to-contact capacitor is defined, wherein the gate electrode functions as one of the conductive plates of the capacitor, the conductive source/drain structures function as the other conductive plate of the capacitor and the spacer is positioned between the two conductive plates. This gate-to-contact capacitor is parasitic in nature in that this capacitor must charge and discharge every time the transistor device is turned on and off, all of which results in delaying the switching speed of the device.

What is needed is a method for forming the CB gate contact above the active region of the transistor device so as to conserve valuable plot space on an IC product, and a device structure that at least reduces the above-described undesirable effects of the gate-to-contact capacitor described above.

SUMMARY OF THE EMBODIMENTS

The following presents a simplified summary of various embodiments of the subject matter disclosed herein in order to provide a basic understanding of some aspects of the technology disclosed herein. This summary is not an exhaustive overview of the technology disclosed herein. It is not intended to identify key or critical elements of the technology disclosed herein or to delineate the scope of the subject matter disclosed herein. Its sole purpose is to present some concepts in a simplified form as a prelude to the more detailed description that is discussed later.

Generally, the present disclosure is directed to various embodiments of a gate contact structure positioned above an active region of a transistor device with air gaps positioned adjacent the gate structure and methods of making such a structure. In one illustrative example, an integrated circuit product disclosed herein includes a transistor device comprising a T-shaped gate structure positioned above an active region defined in a semiconducting substrate, the T-shaped gate structure having an upper portion and a lower portion, wherein the upper portion has a greater lateral width in a current transport direction of the transistor device than the lower portion. The integrated circuit product also includes first and second conductive source/drain structures positioned adjacent opposite sidewalls of the T-shaped gate structure and first and second air gaps positioned adjacent opposite sidewalls of the T-shaped gate structure, wherein each of the air gaps is positioned between at least the lower portion of the T-shaped gate structure and adjacent conductive source/drain structures.

BRIEF DESCRIPTION OF THE DRAWINGS

The disclosure may be understood by reference to the following description taken in conjunction with the accompanying drawings, in which like reference numerals identify like elements, and in which.

Figure 1:
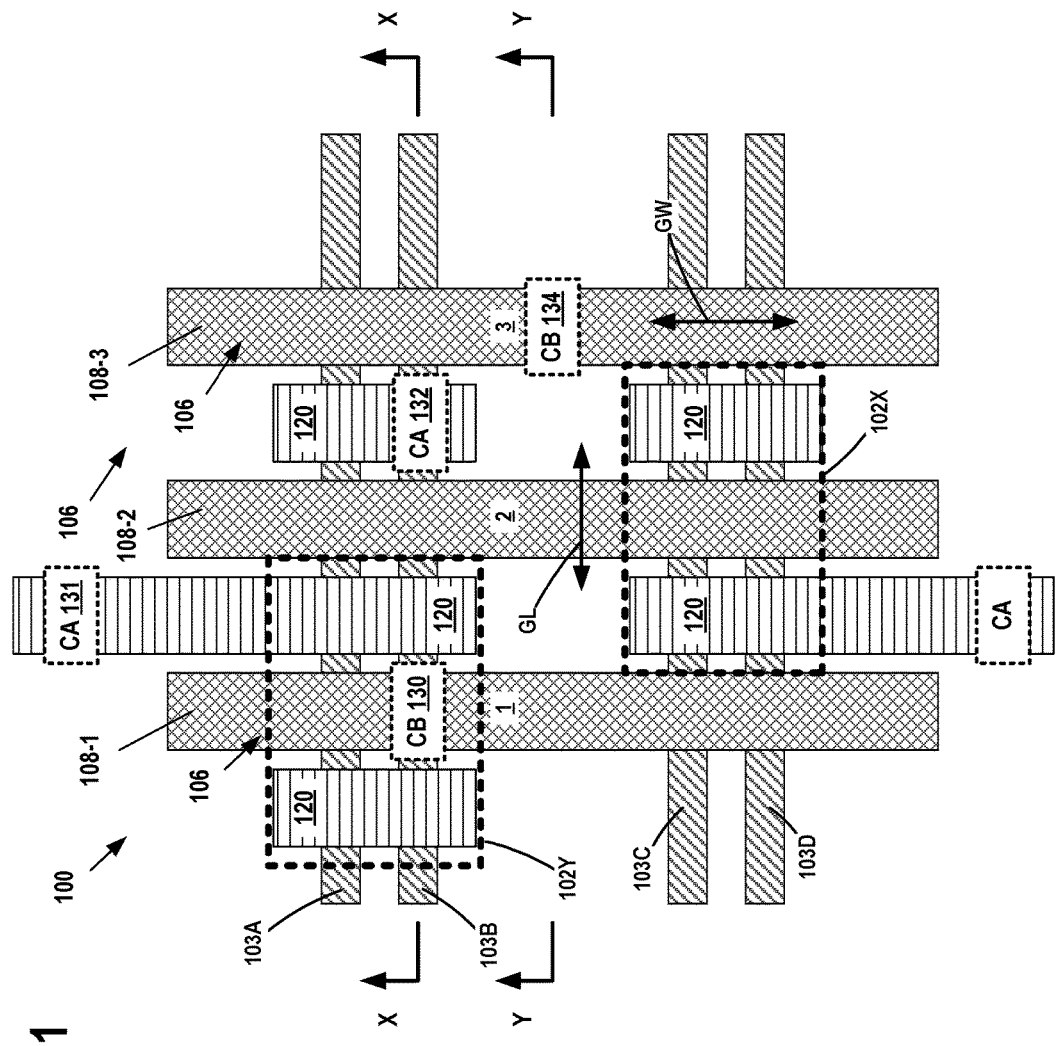
FIGS. 1-16 depict various embodiments of a gate contact structure positioned above an active region of a transistor device with air gaps positioned adjacent the gate structure and methods of making such a structure.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various embodiments of a gate contact structure positioned above an active region of a transistor device with air gaps positioned adjacent the gate structure and methods of making such a structure. The various methods disclosed herein are described in the illustrative context of forming device level contact structures, such as source/drain contact structures and gate contact structures, on IC products. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. In the illustrative examples depicted herein, the transistor devices will be FinFET devices. In the examples depicted herein, the gate structures for the transistor devices will be depicted as being formed using "replacement gate" manufacturing techniques. Of course, the illustrative embodiments of the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 1-16 depict various methods of forming contact structures, such as source/drain contact structures and gate contact structures, on an IC product 100. FIG. 1 is a simplistic plan view of one illustrative embodiment of an IC product 100 that may be formed using the methods described herein. Various cross-sectional views of the product 100 (views "X-X" and "Y-Y") are taken where indicated in FIG. 1. The cross-sectional views are taken in the gate length direction of the transistor devices.

Figure 2:
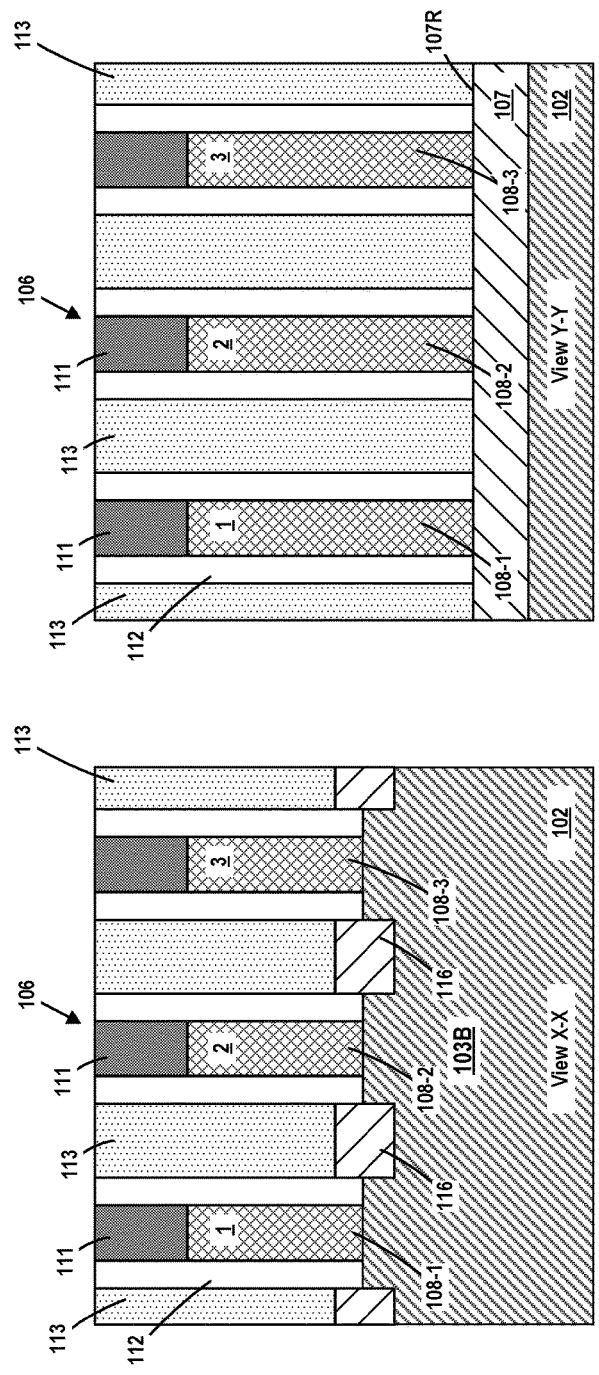

With reference to FIGS. 1 and 2, the product 100 generally comprises a plurality of gates 106 (numbered 1-3 for ease of reference) for various transistor devices that are formed in and above a semiconductor substrate 102. In the illustrative example depicted herein, the transistor devices are FinFET devices, but the inventions disclosed herein should not be considered to be limited to IC products that include FinFET transistor devices, as the methods disclosed herein may be used to form contact structures on a variety of different types of transistor devices. At the point of processing shown in FIGS. 1-2, a plurality of fins 103A-D (collectively referenced using the numeral 103) have been formed in the substrate 102 using traditional manufacturing techniques, and the gates 106 have been formed across the fins 103. Also depicted are illustrative conductive source/drain structures 120 (e.g., trench silicide structures) that are conductively coupled to the source/drain regions of the transistor devices.

FIG. 1 also depicts an illustrative CB gate contact structure 130 that will be formed to contact the gate structure 108-1 of gate 1. The CB gate contact structure 130 will be formed above the active region of the transistor device. As used herein, the term "active region" should be understood to be the generally rectangular shaped area or "footprint" where the conductive source/drain structures 120 comprise a metal silicide material as well as the portion of the gate 106 itself that is positioned between the two conductive source/drain structures 120 that comprise the metal silicide material. FIG. 1 depicts an illustrative active region (dashed line region 102X) for the transistor device that includes gate number 2, as well as the active region (dashed line region 102Y) for the transistor device that includes gate number 1. In the gate length (GL) or current transport direction of the device, the active region for the transistor that comprises gate 2 basically extends between the laterally adjacent gate structures 1 and 3. In the gate width (GW) direction, the active region has a dimension that is approximately equal to the dimension (in the gate width direction) between the outermost edges of the metal silicide material formed in the source/drain regions of the transistor device even where the metal silicide material in the source/drain regions is not one continuous layer of material. Also depicted in FIG. 1 is the location where a CB gate contact structure 134 will be formed to contact the gate structure 108-3 of gate 3. In one illustrative embodiment, the CB gate contact structure 134 is formed entirely above isolation material. Lastly, FIG. 1 also depicts a plurality of CA contact structures 131, 132, etc. that will be formed to contact the conductive source/drain structures 120 of the various transistor devices.

As indicated in FIG. 1, the cross-sectional view X-X is taken through the gates 106 in a gate-length direction of the transistor devices at a location where the CB gate contact structure 130 and the CA contact structure 132 will be formed. In the case where the transistor devices are FinFET devices, the view X-X should be understood to be a cross-sectional view taken through the long axis of the fin 103B in a direction that corresponds to the gate length (current transport) direction of a FinFET device. The cross-sectional view Y-Y is taken through the gates 106 in a gate-length direction of the transistor devices at a location where the CB gate contact structure 134 will be formed above isolation material.

The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

FIG. 2 depicts the IC product 100 after several process operations were performed. First, as noted above, the fins 103 were formed by performing one or more etching processes, e.g., anisotropic etching processes, through a patterned fin-formation etch mask (not shown) to form a plurality of fin-formation trenches in the substrate 102 and thereby define a plurality of fins 103. The width and height of the fins 103 may vary depending upon the particular application. Additionally, the overall size, shape and configuration of the fin-formation trenches and fins 103 may vary depending on the particular application. Next, a recessed layer of insulating material 107 (e.g., silicon dioxide) with a recessed upper surface 107R was formed between the fins 103 by performing traditional manufacturing techniques.

Still with reference to FIG. 2, after the layer of insulating material 107 was recessed, the gates 106 were formed above the fins 103. Each of the gates 106 includes a schematically depicted sacrificial gate structure 108 (numbered 108-1 to 108-3 for reference purposes), a gate cap 111 and a simplistically-depicted sidewall spacer 112. The lateral thickness (at its base) of the simplistically-depicted sidewall spacer 112 may vary depending upon the particular application.

Still referencing FIG. 2, after formation of the sacrificial gate structures 108, epi semiconductor material 116 was formed on the exposed portions of the active regions (or fins 103 in the case of a FinFET device), i.e., in the source/drain regions of the devices, by performing an epitaxial growth process. The epi material 116 may be formed to any desired thickness. However, it should be understood that the epi material 116 need not be formed in all applications. Other layers of material, such as contact etch stop layers and the like, are not depicted in the drawings. After formation of the epi semiconductor material 116, a layer of insulating material 113 (e.g., silicon dioxide) was blanket-deposited across the substrate. Thereafter a CMP process was performed to planarize the layer of insulating material 113 using the original gate caps 111 positioned above the sacrificial gate structures 108 as a polish-stop layer.

Figure 3:
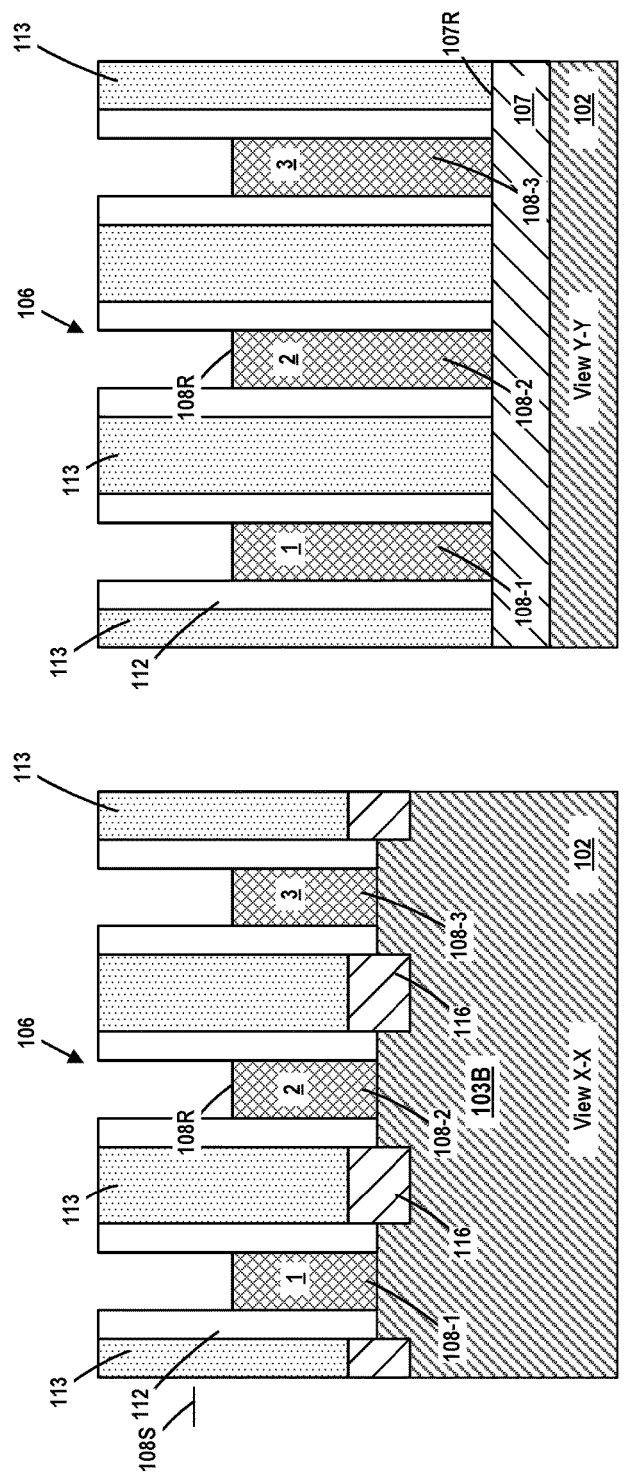

FIG. 3 depicts the IC product 100 after several process operations were performed. First, the gate caps 111 were removed so as to thereby expose the sacrificial gate structures 108. Then, in one illustrative embodiment, a recess etching process was performed to remove at least a portion of the materials of the sacrificial gate structures 108 such that they now have a recessed upper surface 108R that is below the level of the initial upper surface of the sacrificial gate structures 108, as indicated by the line 108S in FIG. 3. The amount of recessing of the sacrificial gate structures 108 may vary depending upon the particular application. In one illustrative embodiment, the sacrificial gate structures 108 may be recessed about 20-80 nm.

Figure 4:
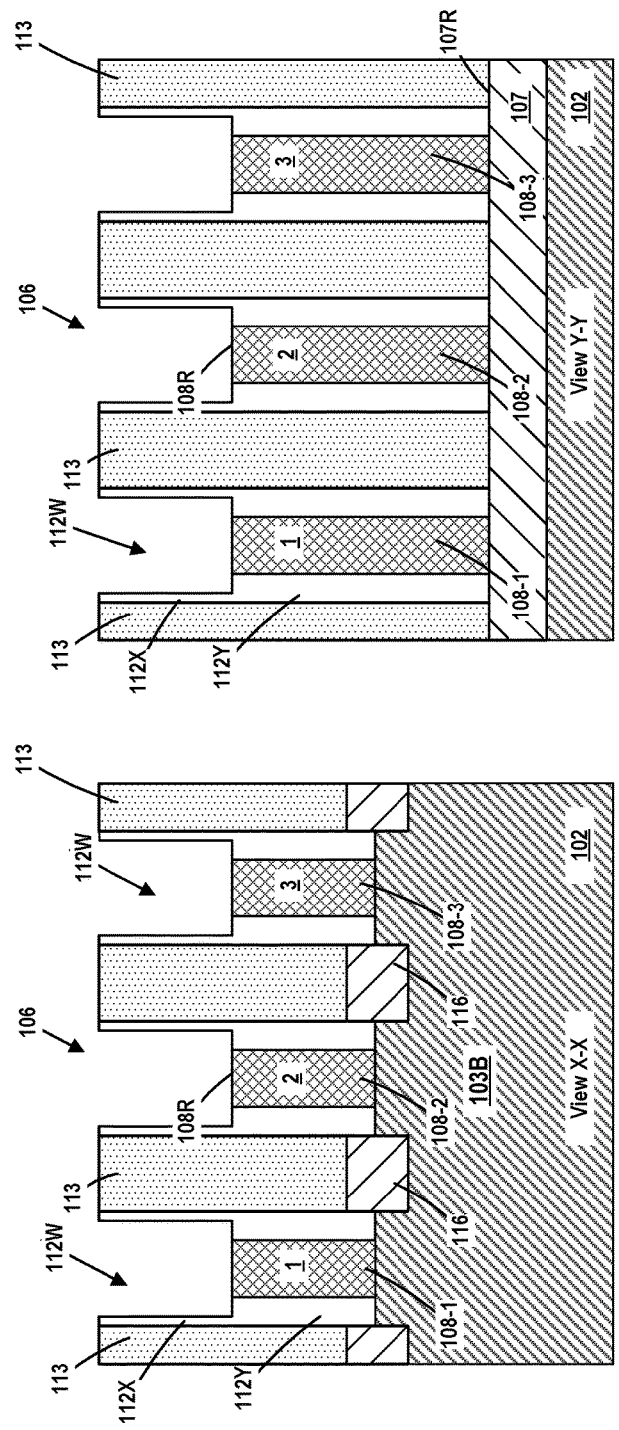

FIG. 4 depicts the IC product after a spacer trim etching process was performed to reduce the thickness of the portions of the spacers 112 positioned above the upper surface of the sacrificial gate structures 108. This results in the spacers 112 having a reduced thickness upper portion 112X and a lower portion 112Y that has the same thickness as the original spacer 112. In one illustrative embodiment, the thinning of the upper portion 112X of the spacer 112 may be accomplished by performing a timed isotropic etching process. The amount of thickness reduction of the upper portion 112X of the spacer 112 may vary depending upon the particular application, e.g., the lateral thickness of the upper portion 112X may be about 40-70% of its original lateral thickness after the etching process is completed. During this etching process, there may be some vertical pull-down of the upper portion 112X of the spacer, but such pull-down is not reflected in the drawings. Additionally, in some embodiments, the spacer 112 may be a single spacer made of a single material, e.g., silicon nitride or a low-k material. In other applications, the spacer 112 may be comprised of two spacers made of two different materials (a situation not depicted in the drawings) wherein the materials are selected such that a selective etching process may be performed to selectively remove the portions of the inner spacer above the sacrificial gate structures 108 relative to the outermost spacer. At the conclusion of the spacer-trimming etch process, an upper enlarged spacer cavity 112W is formed between the upper portions 112X of the spacers and the upper surface of the sacrificial gate structures 108.

Figure 5:
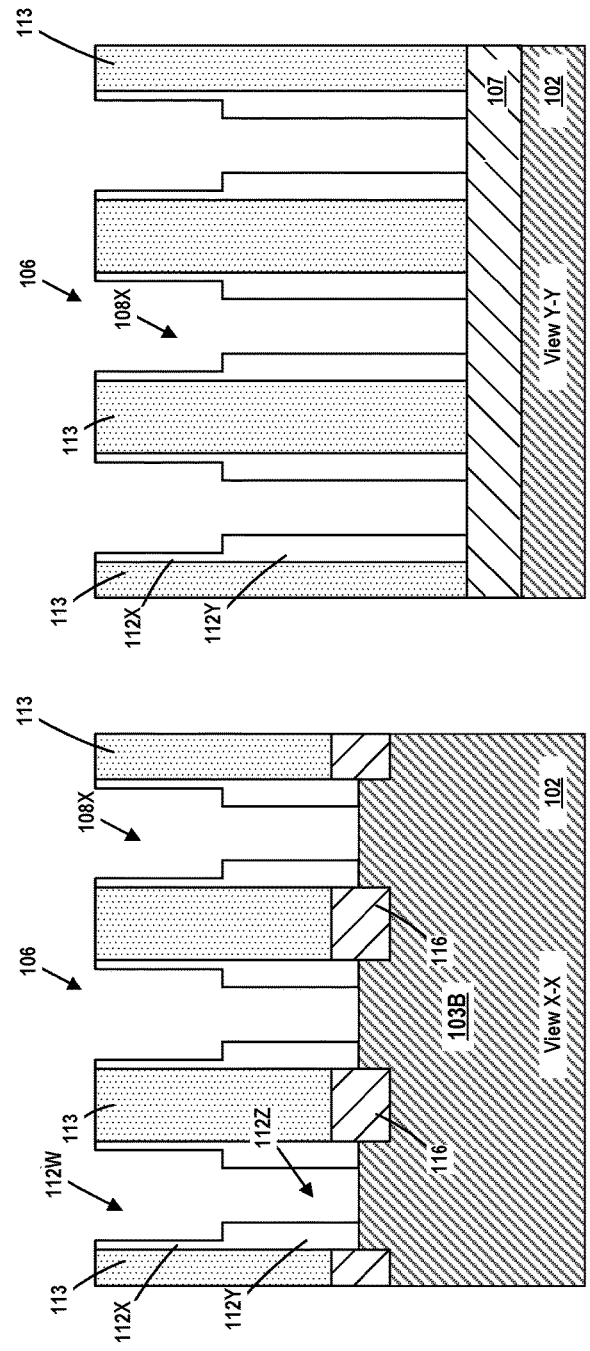

FIG. 5 depicts the product 100 after one or more etching processes were performed to remove the sacrificial gate structures 108 (which may include a sacrificial gate insulation layer comprised of silicon dioxide and a sacrificial gate electrode structure comprised of amorphous silicon or polysilicon). This process operation results in the formation of a plurality of replacement gate cavities 108X where a replacement gate structure will be formed. In this example, each of the replacement gate cavities 108X is defined by a combination of the upper enlarged spacer cavity 112W and a lower spacer cavity 112Z (between the non-etched lower portions of the original spacer 112), wherein the upper enlarged spacer cavity 112W has a greater lateral width than does the lower spacer cavity 112Z.

Figure 6:
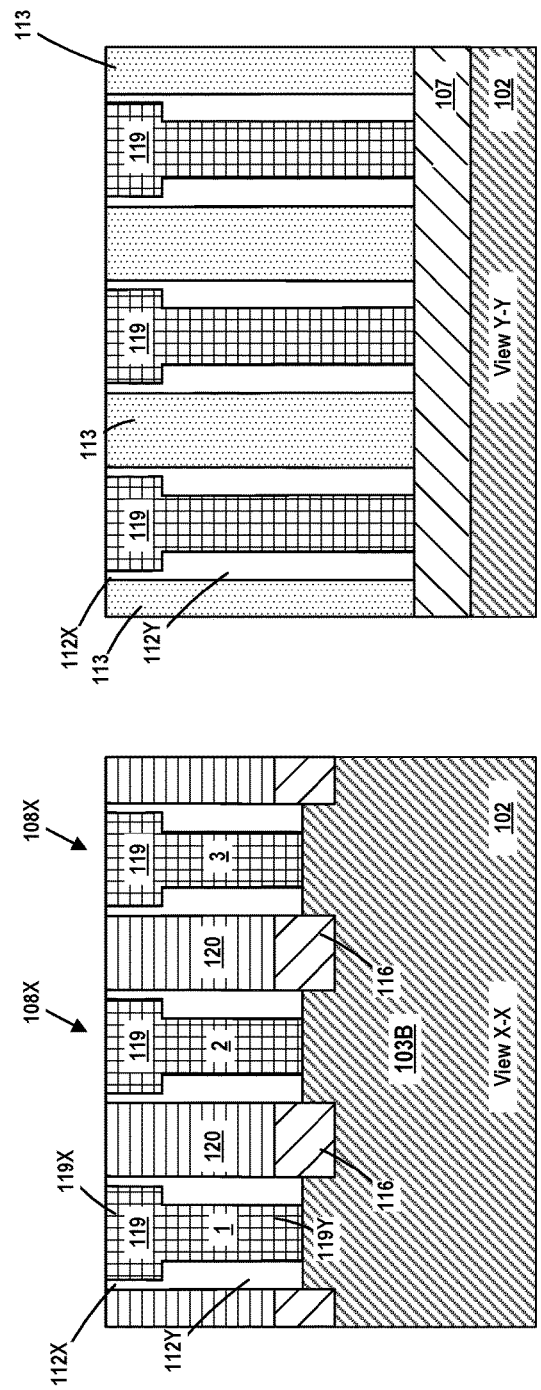

FIG. 6 depicts the IC product 100 after several process operations were performed. First, several deposition processes were performed to form simplistically depicted replacement gate structures 119 in the gate cavities 108X. The final replacement gate structures typically include a gate insulation layer (not separately shown) and one or more layers of conductive material (not separately shown) that collectively function as the conductive gate electrode for the replacement gate structures 119. The final gate insulation layer may be comprised of a variety of different materials, e.g., a high-k (k value of 10 or greater) material. The conductive gate electrode may be comprised of materials such as one or more layers of metal or metal alloys, a work function material layer, etc. A planarization process was performed to remove portions of the materials for the replacement gate structures 119 formed above the layer of insulating material 113 outside the gate cavities 108X. Note that, at this point in the process flow, the replacement gate structures have a generally T-shaped configuration, i.e., the gate structure 119 comprises a wider upper portion 119X and a narrower lower portion 119Y. The differences in the lateral width (in the gate length direction of the devices) of the upper portion 119X and the lower portion 119Y may vary depending upon the particular application. In one illustrative embodiment, the upper portion 119X may be about 2-6 nm wider than the lower portion 119Y. Next, one or more etching processes were performed through a patterned etch mask (not shown) to selectively remove the exposed portions of the layer of insulating material 113 positioned above the active regions relative to the surrounding materials and expose the regions of epi material 116. Then, the patterned etch mask was removed. At that point, the conductive source/drain structures 120, e.g., trench silicide containing regions, were formed so as to contact the raised epi source/drain regions 116 (the source/drain regions). The conductive source/drain structures 120 constitute the conductive source/drain metallization structures that will eventually be conductively coupled to the conductive source/drain contact structures (CA) that are to be subsequently formed on the product 100. As noted above, the conductive source/drain structures 120 provide an electrical path between the source/drain regions of the devices (including the raised epi source/drain regions 116) and the conductive source/drain contact structures (CA) that are to be subsequently formed for the product 100. The configuration and structure of the conductive source/drain structures 120 may vary depending upon the particular application. In one example, the conductive source/drain structures 120 are line-type structures that extend into and out of the plane of the drawing page in FIG. 6 that extend for substantially the entire length of the active region (in a direction that corresponds to the gate width direction of the device). In some cases, the conductive source/drain structures 120 comprise a trench metal silicide material (not separately shown) that is formed on and in contact with the raised epi source/drain regions 116, and a metal material, such as tungsten (not separately shown), that is formed on and in contact with the trench metal silicide material. After the formation of the materials that make up the conductive source/drain structures 120, a chemical mechanical polishing (CMP) process was performed to remove excess materials located above the upper surface of the replacement gate structures 119.

Figure 7:
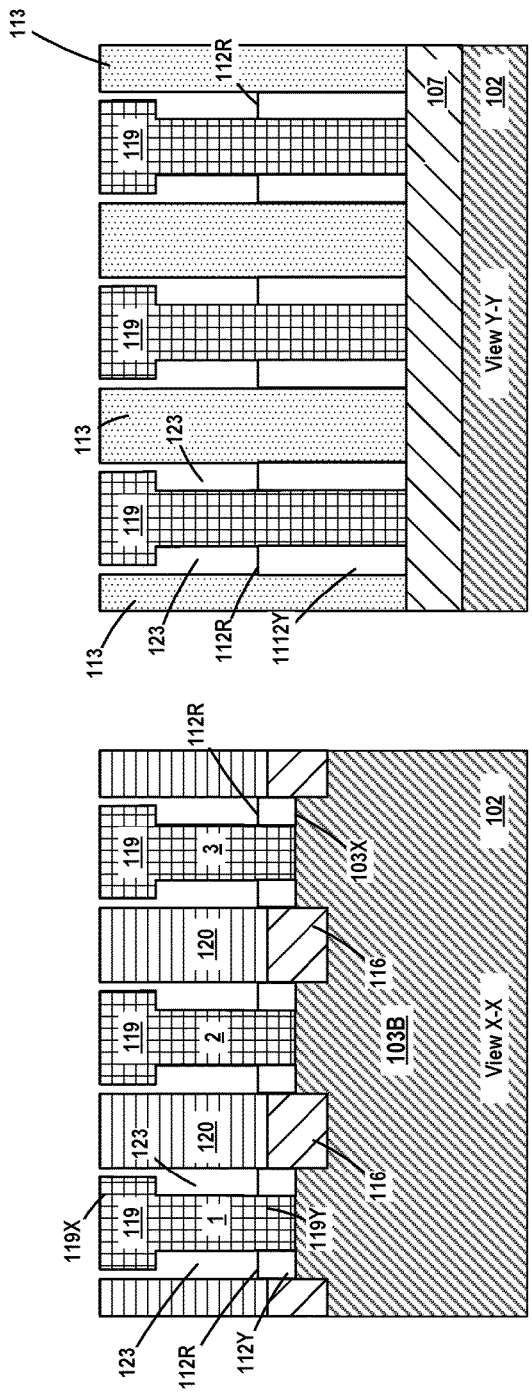

FIG. 7 depicts the IC product 100 after a recess etching process was performed to remove the upper portion 112X and at least a portion of the vertical height of the lower portion 112Y of the spacers 112. In the depicted example, at the conclusion of this etching process, the lower portion 112Y of the spacers 112 has a recessed upper surface 112R and spaces 123 are formed on opposite sides of the replacement gate structures 119 above the recessed lower portions 112Y. The amount of recessing of the lower portion 112Y of the spacers 112 may vary depending upon the particular application. In one illustrative embodiment, the surface 112R may be about 0-15 nm above the upper surface 103X of the fin 103. However, as will be appreciated by those skilled in the art after a complete reading of the present application, in some embodiments, the entirety of the lower portion 112Y of the spacer 112 may be removed such that the underlying isolation material 107 (see view Y-Y) is exposed at the completion of the etching process.

Figure 8:
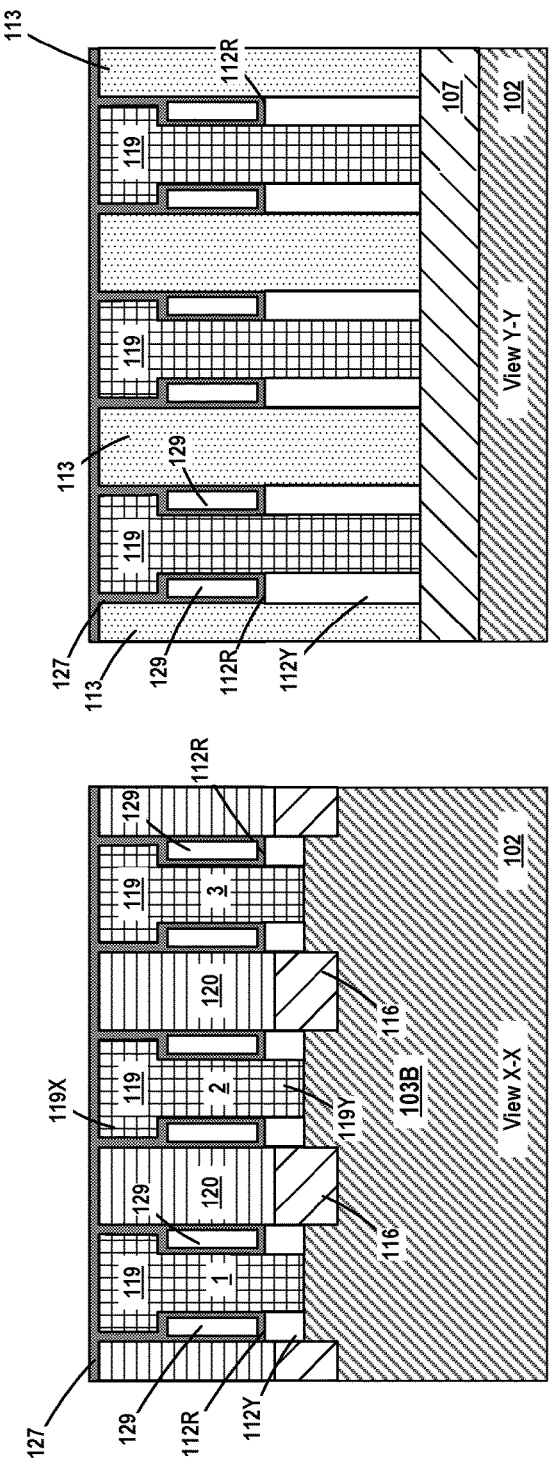

FIG. 8 depicts the product after a conformal deposition process was performed to form a relatively thin spacer material 127 on the product 100. In one illustrative example, the material 127 may be a low-k material (k value of 7 or less) and it may be formed by performing a conformal ALD process. Due to the relatively tight spacing between the wider upper portion 119X of the replacement gate structures 119 and the conductive source/drain structures 120, the material 127 tends to "pinch off" in the area between the upper portion 119X of the replacement gate structure 119 and the conductive source/drain structures 120. As a result, an air gap 129 is formed at least adjacent the opposite sidewalls of the narrower lower portion 119Y of the replacement gate structures 119. In one embodiment, this results in the formation of a single continuous air gap 129 (i.e., an air gap spacer) located adjacent the sidewalls of each gate structure 119 above the recessed lower portion 112Y of the sidewall spacers and around the entire perimeter of the gate structure 119. The vertical extent (or height) and the lateral width of the air gap 129 may vary depending upon the application and the manner in which the deposition process is performed to form the spacer material 127. As noted above, if a process flow is selected that involves forming the gate cavities 108X only above the active region and not around the ends of the gates 106, the air gap 129 would also not be formed around the entire perimeter of the gate structure 119. Rather, in such a case, when looking at a single device, there would be two non-connected air gaps 129 that are formed adjacent opposite sidewalls of the gate structure 119, i.e., the air gaps 129 would not be formed around the ends of the gate structure 119 that are positioned above the isolation material.

Figure 9:
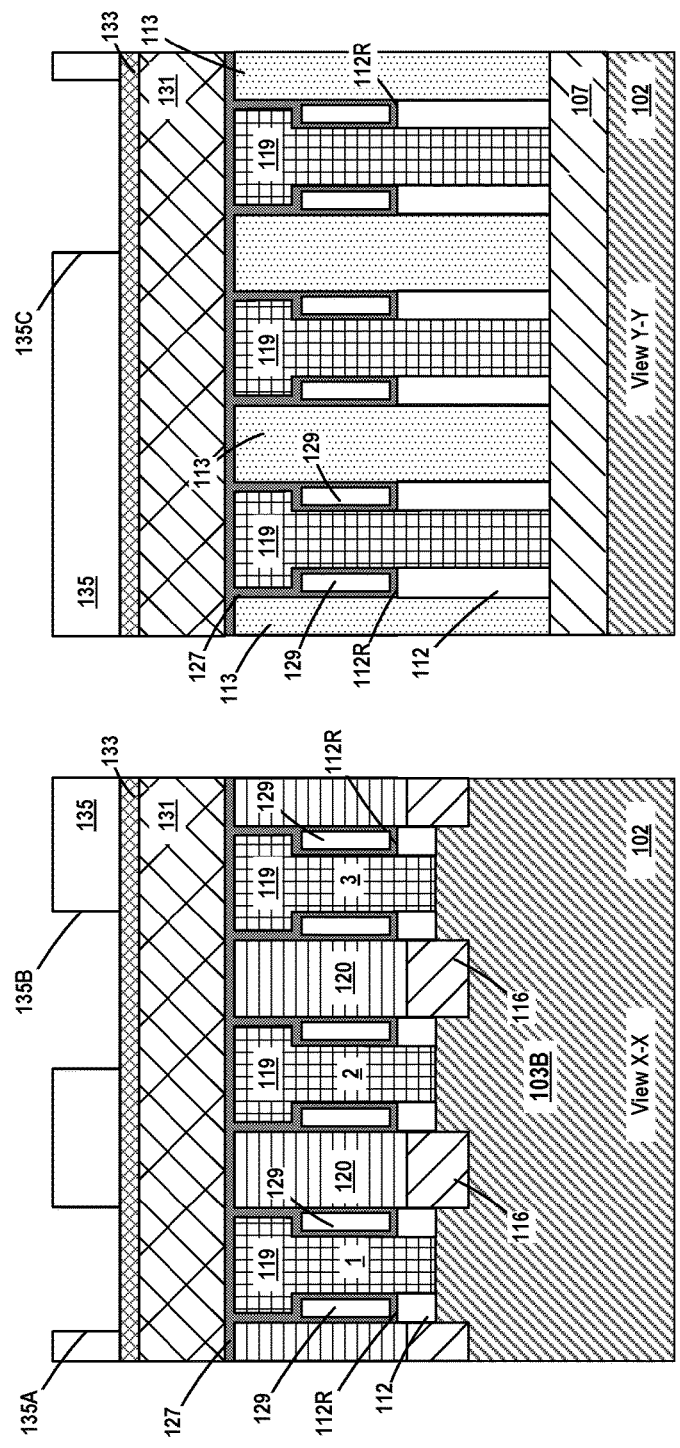

FIG. 9 depicts the product 100 after several process operations were performed. First, a sacrificial layer of material 131, e.g., OPL, was formed above the product 100. Thereafter, an ARC layer 133 and a patterned etch mask 135 e.g., a patterned layer of photoresist, was formed above the sacrificial layer of material 131. The patterned etch mask 135 comprises a plurality of openings 135A, 135B and 135C that correspond to locations where, respectively, the CB gate contact structure 130, the CA contact structure 132 and the CB contact structure 134 will be formed. The patterned etch mask 135 is representative in nature in that it may be comprised of one or more layers of materials.

Figure 10:
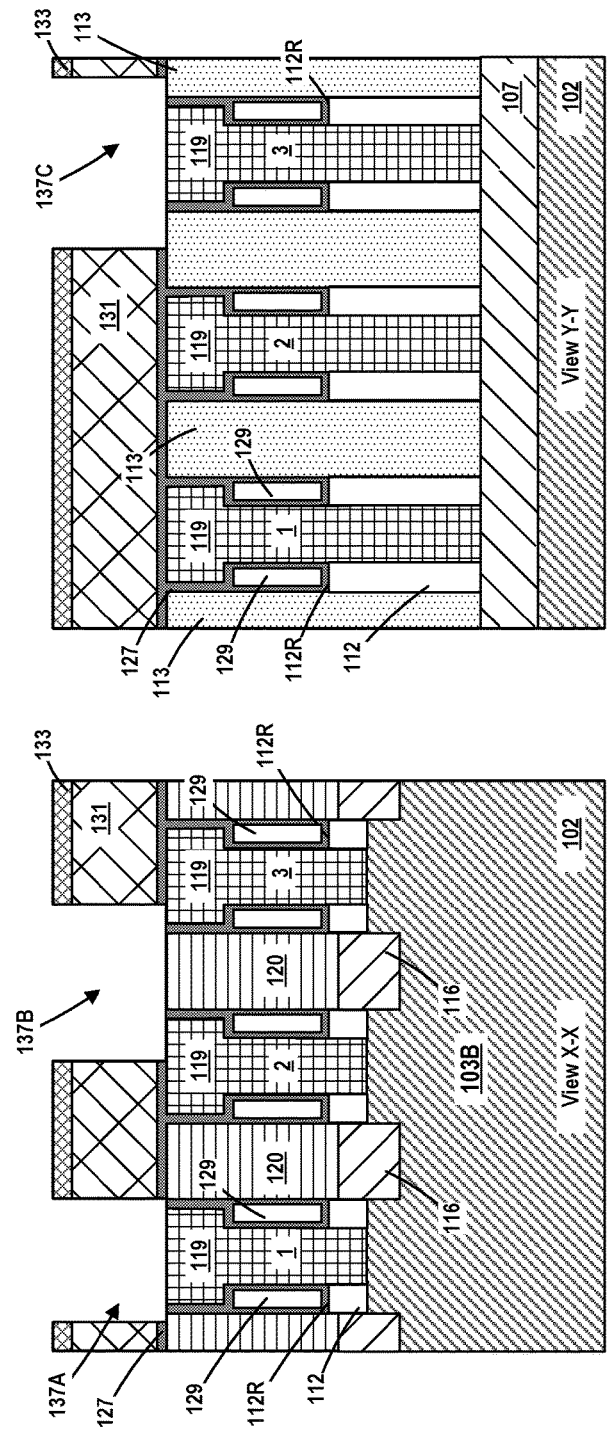

FIG. 10 depicts the product 100 after several process operations were performed. First, one or more etching processes were performed through the patterned etch mask 135 to remove portions of the ARC layer 133 and the sacrificial layer of material 131. Removal of portions of the sacrificial layer of material 131 stops on the spacer material 127. Note that, during the etching of the sacrificial layer of material 131, the patterned etch mask 135 (see FIG. 9) will also be removed due to the similarity of the materials selected for the layers 131 and 135. At that point, a brief etching process is performed to remove exposed portions of the spacer material 127. This results in the formation of, respectively, a CB gate contact opening 137A, a CA contact opening 137B and a CB contact opening 137C. As depicted, a portion of the axial length (into and out of the drawing page) of the gate structure 119 for gate 1 that is positioned above the active region is exposed by the CB gate contact opening 137A; a portion of the axial length of the source/drain contact structure 120 positioned between the gate structures 119 for gates 2 and 3 is exposed by the CA contact opening 137B; and a portion of the axial length of the gate structure 119 for gate 3 that is positioned above the isolation region 107 is exposed by the CB gate contact opening 137C.

Figure 11:
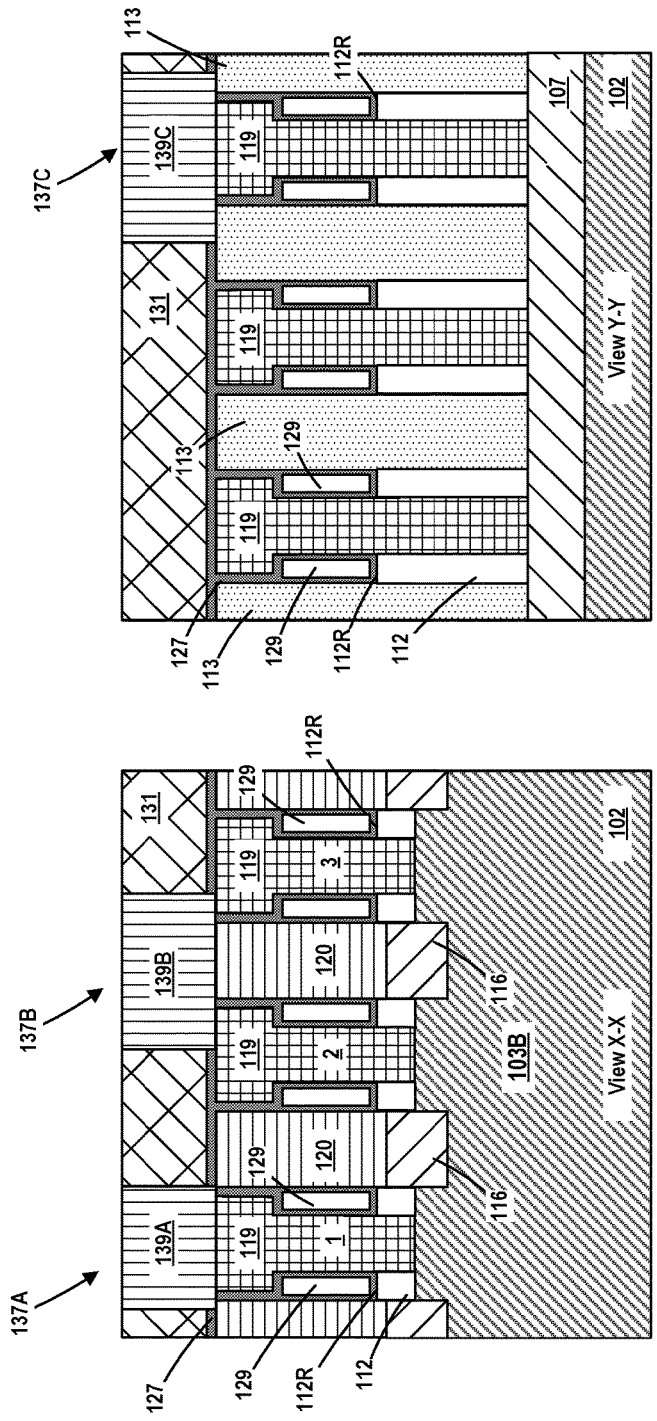

FIG. 11 depicts the product 100 after a plurality of sacrificial contact structures 139 were formed on the product. More specifically, a sacrificial CB gate contact structure 139A, a sacrificial CA contact structure 139B and a sacrificial CB contact structure 139C was formed, respectively, in the CB gate contact opening 137A, the CA contact opening 137B and the CB contact opening 137C. The sacrificial contact structures 139 may be made of a variety of different materials, e.g., amorphous silicon, silicon nitride, that may be selectively removed to a layer of insulating material that will be formed on the product as described more fully below. The sacrificial contact structures 139 may be formed by depositing the material for the sacrificial contact structures 139 in the openings 137A-C and thereafter performing one or more CMP and/or etch-back processes to remove excess materials. The ARC layer 133 will also be removed as part of these process operations.

Figure 12:
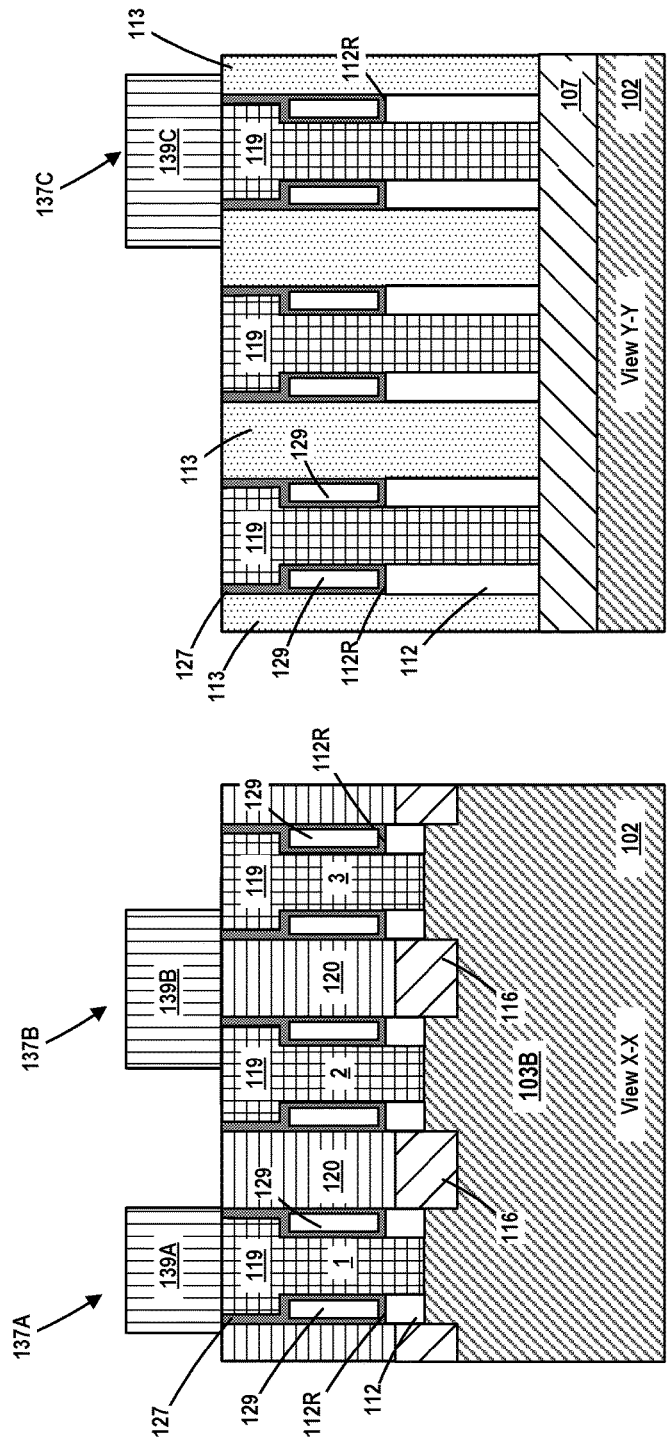

FIG. 12 depicts the product 100 after several process operations were performed. First, an etching process was performed remove the sacrificial layer of material 131 relative to the surrounding materials. Thereafter, an etching process was performed to remove the exposed portions of the spacer material 127. These process operations expose the portions of the product not covered by the sacrificial contact structures 139.

Figure 13:
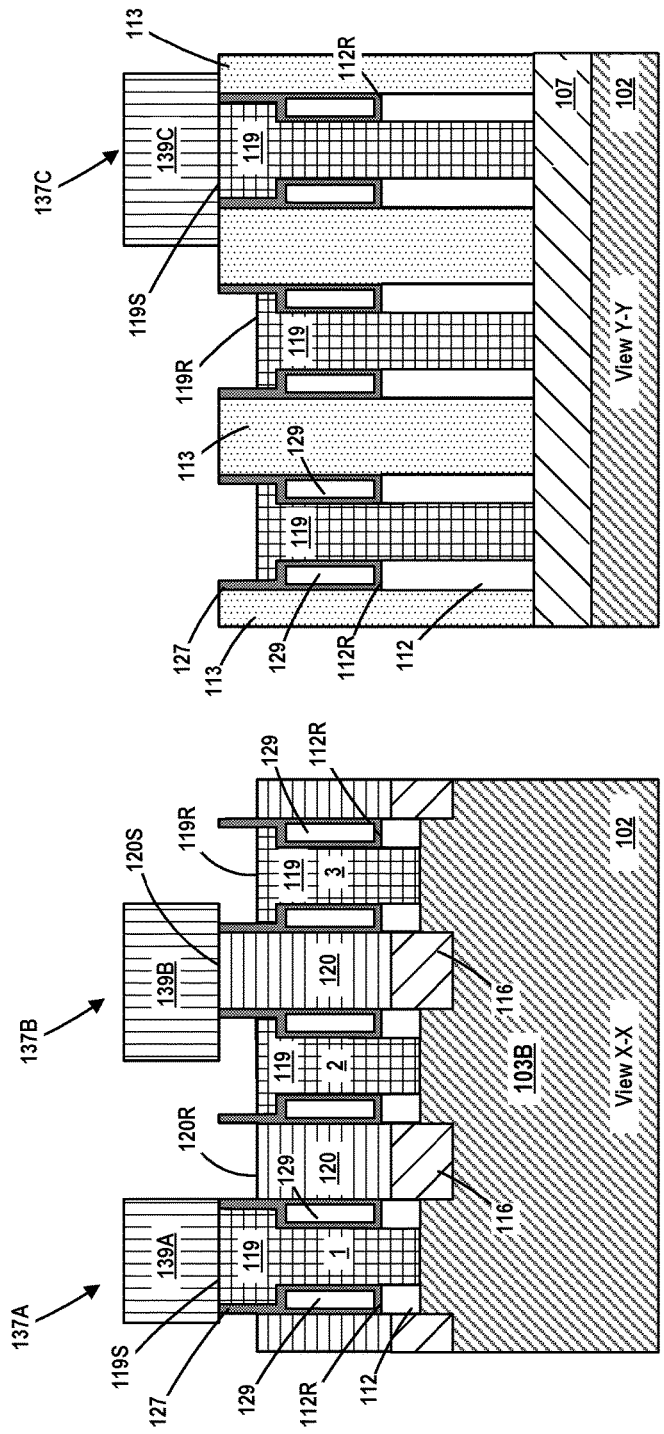

FIG. 13 depicts the IC product 100 after one or more recess etching processes were performed to recess the exposed portion of the gate structures 119 that are not protected by the sacrificial CB gate contact structure 139A and the sacrificial CB contact structure 139C and the exposed portion of the conductive source/drain structures 120 that are not protected by the sacrificial CA contact structure 139B. At the completion of these one or more recess etching processes, the exposed portions of the gate structures 119 (the portions not protected by the sacrificial structures 139A and 139C) have a recessed upper surface 119R. Stated another way, the portions of the gate structures 119 located under the sacrificial structures 139A and 139C have an upper surface 119S that is positioned at a level that is above the level of the recessed upper surface 119R of the remaining portions of the gate structures 119. Thus, in a direction corresponding to the axial length of the gate structure 119 (i.e., in the gate width direction of the transistor device), the gate structure 119 has a stepped configuration, with the portion of the gate structures 119 located under the sacrificial structures 139A and 139C having a higher upper surface 119S as compared to the remaining recessed portions of the gate structures 119 that have the lower recessed upper surface 119R. Similarly, the exposed portion of the conductive source/drain structures 120 (the portions not protected by the sacrificial structure 139B) have a recessed upper surface 120R. Stated another way, the portion of the conductive source/drain structures 120 located under the sacrificial structure 139B has an upper surface 120S that is positioned at a level that is above the level of the recessed upper surface 120R of the remaining portions of the conductive source/drain structures 120. Thus, the conductive source/drain structures 120 also have a stepped configuration in a direction corresponding to the axial length of the conductive source/drain structures 120 (i.e., in the gate width direction of the transistor device), wherein the portion of the conductive source/drain structure 120 located under the sacrificial structure 139B has a higher upper surface 120S as compared to the remaining recessed portions of the conductive source/drain structures 120 that have the lower recessed upper surface 120R. The amount of recessing of the gate structures 119 and the conductive source/drain structures 120 may vary depending upon the particular application, and the amount of recessing of the gate structures 119 and the amount of recessing of the conductive source/drain structures 120 need not necessarily be the same, although such substantially equal recessing may occur in some applications. In one illustrative embodiment, the gate structures 119 and the conductive source/drain structures 120 may be recessed by an amount of about 3-10 nm. In one particular example, the recessing of the gate structures 119 may be such so as to remove the wider upper portion 119X of the gate structures 119 leaving only the narrower lower portions 119Y of the gate structures 119 after the completion of the recess etching process. However, that situation is not depicted in the attached drawings. As depicted, these process operations expose the portions of the gate structures 119 and the conductive source/drain structures 120 (considered collectively) not covered by the sacrificial contact structures 139.

Figure 14:
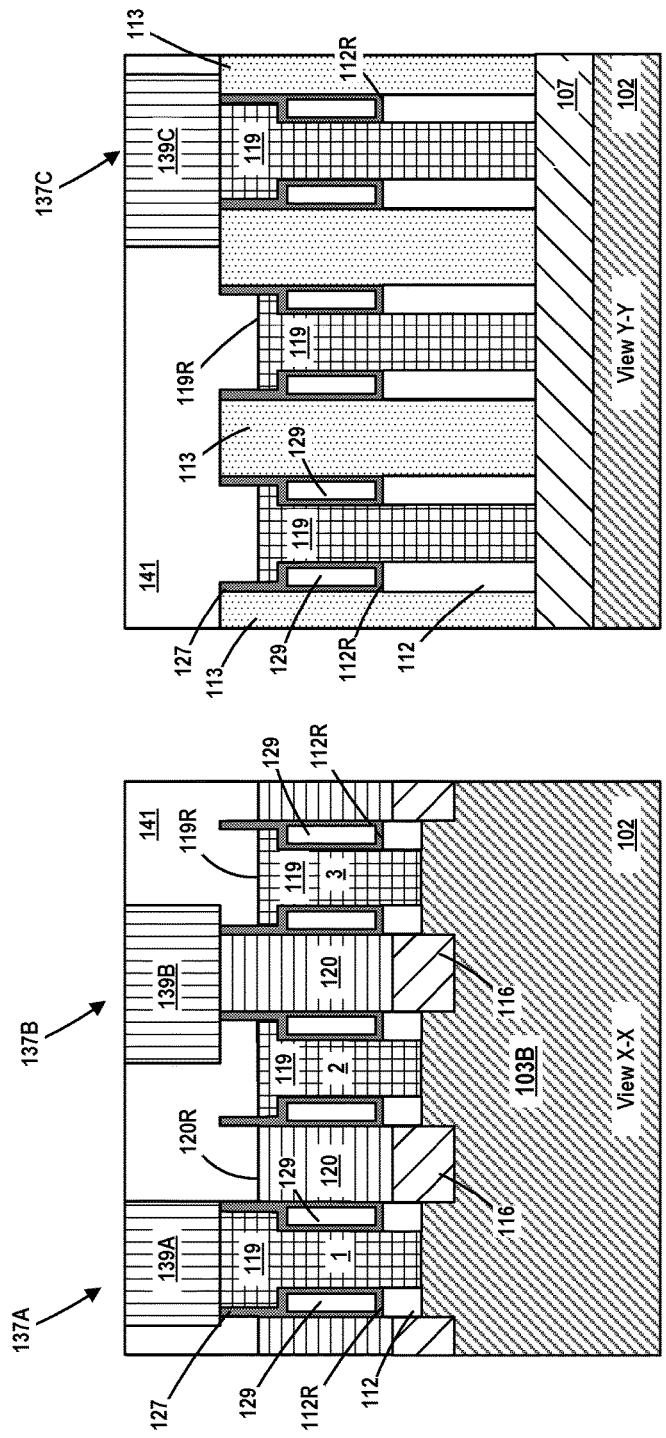

FIG. 14 depicts the IC product 100 after a layer of insulating material 141 was deposited on the product and after one or more CMP processes and/or etch-back processes were performed to remove excess amount of the insulating material 141 positioned above the upper surface of the sacrificial contact structures 139.

Figure 15:
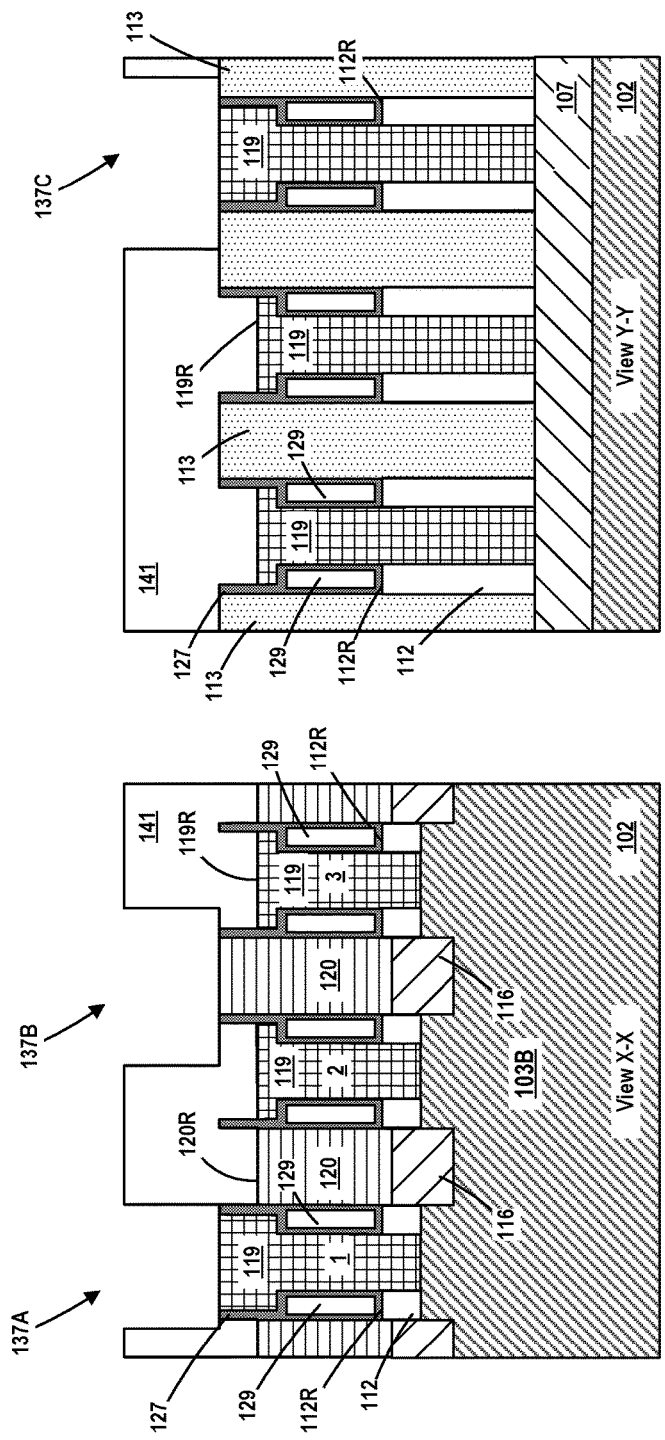

FIG. 15 depicts the IC product 100 after at least one selective etching process was performed to remove the sacrificial contact structures 139 relative to the surrounding materials. In one illustrative embodiment, the process operation re-establishes the CB gate contact opening 137A, the CA contact opening 137B and the CB contact opening 137C.

Figure 16:
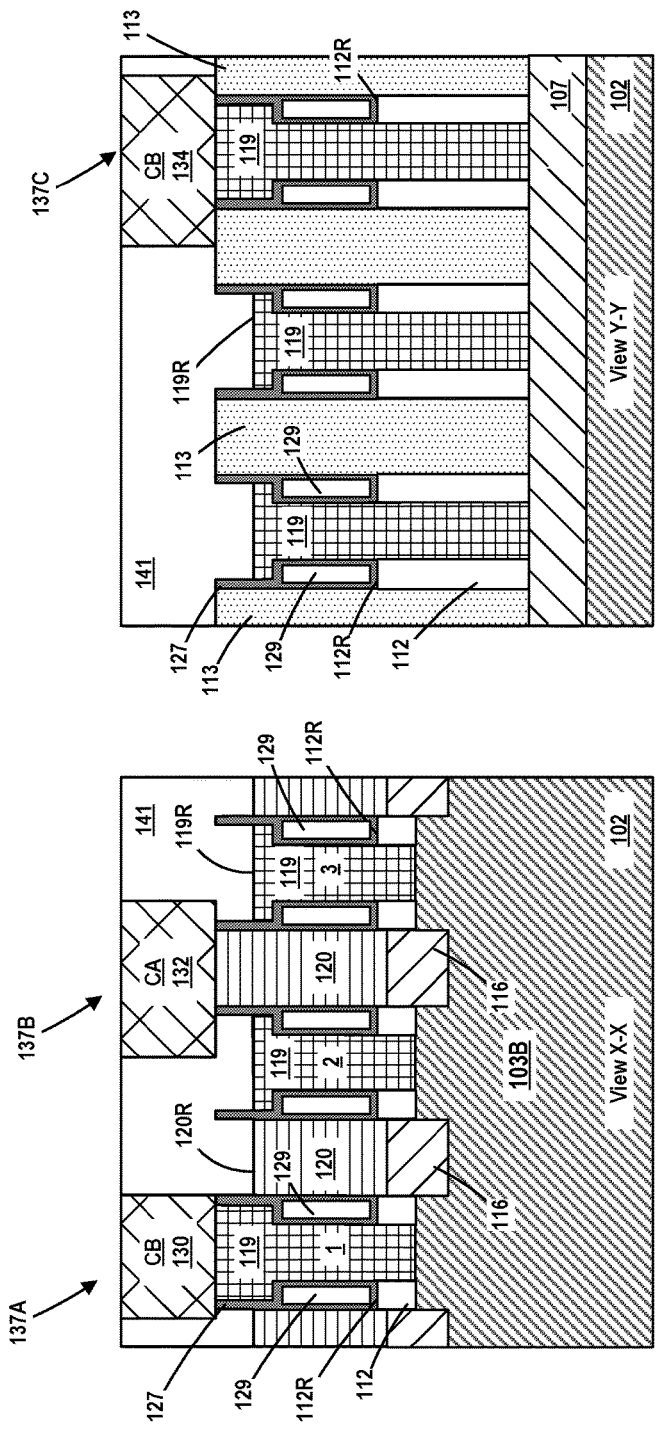

FIG. 16 depicts the product 100 after several process operations were performed to form the CB gate contact structure 130, the CA contact structure 132 (as well as other CA contact structures) and the CB gate contact structure 134 for the transistor devices. The contact structures 130, 132 and 134 may be comprised of a variety of different materials and they may be formed by performing various manufacturing techniques. In one illustrative example, one or more conformal barrier layers and/or seed layers (not separately shown) were formed so as to line the contact openings 137A-C, and one or more conductive materials (e.g., copper, a metal-containing material, a metal compound, etc.) were then formed on the product 100 so as to overfill the openings 137A-C. At that point, a CMP process was performed to remove excess portions of the conductive materials from above the upper surface of the layer of insulating material 141. These process operations result in the formation of a CB gate contact structure 130, the CA contact structure 132 and the CB gate contact structure 134. The CB gate contact structure 130 is positioned above the active region and it conductively contacts the non-recessed upper surface 119S of the gate structure 119 of gate 1. The CA contact structure 132 conductively contacts the non-recessed upper surface 120S of the underlying conductive source/drain structure 120. The CB gate contact structure 134 conductively contacts the non-recessed upper surface 119S of the gate structure 119 for gate 3 at a location above the isolation material 107.

As will be appreciated by those skilled in the art after a complete reading of the present application, various novel products and methods are disclosed herein. One illustrative integrated circuit product disclosed herein comprises a transistor device comprising a T-shaped gate structure 119 positioned above an active region defined in a semiconducting substrate, the T-shaped gate structure 119 comprising an upper portion 119X and a lower portion 119Y, wherein the upper portion 119X has a greater lateral width in a current transport direction of the transistor device than the lower portion 119Y, and first and second conductive source/drain structures 120 positioned adjacent opposite sidewalls of the T-shaped gate structure. In this example, the product also includes first and second air gaps 129 positioned adjacent opposite sidewalls of the T-shaped gate structure 119, wherein each of the air gaps 129 is positioned between at least the lower portion 119Y of one of the sidewalls of the T-shaped gate structure 119 and the adjacent conductive source/drain structure 120.

In other embodiments, in a direction corresponding to a gate width direction of the transistor device, the T-shaped gate structure 119 has a non-recessed portion with a first upper surface 119S and a recessed portion with a second upper surface 119R, the second upper surface 119R being positioned at a level below a level of the first upper surface 119S. In yet another embodiment, the product further comprises a conductive gate contact structure 130 that is conductively coupled to the T-shaped gate structure 119, wherein substantially all of the physical contact between the conductive gate contact structure 130 and the T-shaped gate structure 119 occurs at the first upper surface 119S of the T-shaped gate structure 119. In one particular embodiment, the physical contact between the conductive gate contact structure 130 and the T-shaped gate structure 119 occurs only at the first upper surface 119S of the T-shaped gate structure 119.

In yet another embodiment, in a direction corresponding to a gate width direction of the transistor device, the conductive source/drain structures 120 have a non-recessed portion with a first upper surface 120S and a recessed portion with a second upper surface 120R, the second upper surface 120R being positioned at a level below a level of the first upper surface 120S. In other embodiments, the product comprises a conductive source/drain contact structure 132 that is conductively coupled to one of the conductive source/drain structures 120, wherein substantially all of the physical contact between the conductive source/drain contact structure 132 and the conductive source/drain structure 120 occurs at the first upper surface 120S of the conductive source/drain structure 120. In one particular embodiment, the physical contact between the conductive source/drain contact structure 132 and the conductive source/drain structure 120 occurs only at the first upper surface 120S of the conductive source/drain structure.

In even further embodiments, the product includes a conductive source/drain contact structure 132 that is conductively coupled to an upper surface 120S of a conductive source/drain structure 120 (positioned between gates 2 and 3) of another transistor device (the device comprising gate 3), wherein the upper surface 120S of the conductive source/drain structure 120 of the other transistor device is substantially planar with an upper surface 119S of the upper portion of the T-shaped gate structure 119 (for gate 1).

One illustrative method disclosed herein includes forming a gate for a transistor device, the gate comprising a sacrificial gate structure 108, a sidewall spacer 112 positioned adjacent the sacrificial gate structure and a gate cap 111 positioned above the sacrificial gate structure, forming first and second conductive source/drain structures 120 adjacent the sidewall spacer 112 on opposite sidewalls of the sacrificial gate structure 108 and performing an etching process to reduce a lateral thickness of an upper portion 112X of the sidewall spacer 112 that is located above an upper surface of the sacrificial gate structure 108. In this example, the method also includes removing the sacrificial gate structure to form a replacement gate cavity 108X having an upper portion 112X with a first lateral width and a lower portion 112Y having a second lateral width that is less than the first lateral width, the first lateral width being defined by the upper portion 112X of the sidewall spacer with the reduced lateral width, and forming a replacement gate structure 119 in the replacement gate cavity 108X, the replacement gate structure having a T-shaped configuration. The method also includes performing an etching process to remove the upper portion of the sidewall spacer 112 and at least a portion of any remaining portion of the sidewall spacer 112 so as to form a space 123 between a lower portion 119Y of the T-shaped gate structure 119 and each of the first and second conductive source/drain structures 120 positioned adjacent opposite sidewalls of the T-shaped gate structure 119 and forming a second spacer 127 adjacent the T-shaped gate structure 119, the second spacer 127 comprising at least first and second air gaps 129 within the second spacer 127 adjacent opposite sidewalls of the T-shaped gate structure 119.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   a transistor device comprising a T-shaped gate structure positioned above an active region defined in a semiconducting substrate, said T-shaped gate structure comprising an upper portion and a lower portion, wherein said upper portion has a greater lateral width in a current transport direction of said transistor device than said lower portion;
   first and second conductive source/drain structures positioned adjacent opposite sidewalls of said T-shaped gate structure; and
   first and second air gaps positioned adjacent opposite sidewalls of said T-shaped gate structure, wherein each of said air gaps is positioned between at least said lower portion of said T-shaped gate structure and adjacent conductive source/drain structures.

2. The integrated circuit product of claim 1, further comprising a conductive gate contact structure that is conductively coupled to an upper surface of said T-shaped gate structure, wherein an entirety of said conductive gate contact structure is positioned vertically above said active region of said transistor device.

3. The integrated circuit product of claim 1, wherein, in a direction corresponding to a gate width direction of said transistor device, said T-shaped gate structure has a non-recessed portion with a first upper surface and a recessed portion with a second upper surface, said second upper surface being positioned at a level below a level of said first upper surface, and wherein the product further comprises a conductive gate contact structure that is conductively coupled to said T-shaped gate structure wherein substantially all of the physical contact between the conductive gate contact structure and the T-shaped gate structure occurs at said first upper surface of said T-shaped gate structure.

4. The integrated circuit product of claim 1, wherein said first and second air gaps constitute a substantially continuous air space that extends around an entire perimeter of said T-shaped gate structure.

5. The integrated circuit product of claim 2, wherein, at a location adjacent said conductive gate contact structure, each of said first and second conductive source/drain structures has an upper surface that is positioned at a level that is below a level of an upper surface of said upper portion of said T-shaped gate structure.

6. The integrated circuit product of claim 1, further comprising a conductive source/drain contact structure that is conductively coupled to an upper surface of a conductive source/drain structure of another transistor device, wherein said upper surface of said conductive source/drain structure of said another transistor device is substantially planar with an upper surface of said upper portion of said T-shaped gate structure.

7. The integrated circuit product of claim 1, wherein, in a direction corresponding to a gate width direction of said transistor device, at least one of said first and second conductive source/drain structures has a non-recessed portion with a first upper surface and a recessed portion with a second upper surface, said second upper surface being positioned at a level below a level of said first upper surface, and wherein the product further comprises a conductive source/drain contact structure that is conductively coupled to said at least one of said first and second conductive source/drain structures, wherein substantially all of the physical contact between the conductive source/drain contact structure and said at least one of said first and second conductive source/drain structure occurs at said first upper surface of said at least one of said first and second conductive source/drain structures.

8. The integrated circuit product of claim 1, wherein a bottom surface of each of said first and second air gaps is defined by an upper surface of a sidewall spacer positioned on said lower portion of said T-shaped gate structure.

9. The integrated circuit product of claim 8, wherein said sidewall spacer is a single sidewall spacer comprised of a single material.

10. The integrated circuit product of claim 8, wherein said sidewall spacer comprises first and second sidewall spacers made of different materials.

11. The integrated circuit product of claim 1, wherein said first and second air gaps are formed in a sidewall spacer positioned on opposing sidewalls of said lower portion of said T-shaped gate structure.

12. An integrated circuit product, comprising:
a transistor device comprising a T-shaped gate structure positioned above an active region defined in a semiconducting substrate, said T-shaped gate structure comprising an upper portion and a lower portion, wherein said upper portion has a greater lateral width in a current transport direction of said transistor device than said lower portion, and wherein, in a direction corresponding to a gate width direction of said transistor device, said T-shaped gate structure has a non-recessed portion with a first upper surface and a recessed portion with a second upper surface, said second upper surface being positioned at a level below a level of said first upper surface;
first and second conductive source/drain structures positioned adjacent opposite sidewalls of said T-shaped gate structure;
first and second air gaps positioned adjacent opposite sidewalls of said T-shaped gate structure, wherein each of said air gaps is positioned between at least said lower portion of said T-shaped gate structure and adjacent conductive source/drain structures; and
a conductive gate contact structure that is conductively coupled to said T-shaped gate structure, wherein at a location adjacent said conductive gate contact structure, each of said conductive source/drain structures has an upper surface that is positioned at a level that is below a level of the first upper surface of said non-recessed portion of said T-shaped gate structure.

13. The integrated circuit product of claim 12, wherein said first and second air gaps constitute a substantially continuous air space that extends around an entire perimeter of said T-shaped gate structure.

14. The integrated circuit product of claim 12, wherein an entirety of said conductive gate contact structure is positioned vertically above said active region and wherein substantially all of the physical contact between the conductive gate contact structure and the T-shaped gate structure occurs at said first upper surface of said non-recessed portion of the T-shaped gate structure.

15. The integrated circuit product of claim 14, further comprising a conductive source/drain contact structure that is conductively coupled to an upper surface of a conductive source/drain structure of another transistor device, wherein said upper surface of said conductive source/drain structure of said another transistor device is substantially planar with the first upper surface of said non-recessed portion of said T-shaped gate structure.

16. A method, comprising:
forming a gate for a transistor device, said gate comprising a sacrificial gate structure, a sidewall spacer positioned adjacent said sacrificial gate structure and a gate cap positioned above said sacrificial gate structure;
forming first and second conductive source/drain structures adjacent said sidewall spacer on opposite sidewalls of said sacrificial gate structure;
performing an etching process to reduce a lateral thickness of an upper portion of said sidewall spacer that is located above an upper surface of said sacrificial gate structure;
removing said sacrificial gate structure to form a replacement gate cavity having an upper portion with a first lateral width and a lower portion with a second lateral width that is less than said first lateral width, said first lateral width being defined by said upper portion of said sidewall spacer with said reduced lateral width;
forming a replacement gate structure in said replacement gate cavity, said replacement gate structure having a T-shaped configuration and comprising an upper portion and a lower portion, wherein said upper portion has a greater lateral width in a current transport direction of said transistor device than said lower portion;
performing an etching process to remove said upper portion of said sidewall spacer and at least a portion of any remaining portion of said sidewall spacer so as to form a space between a lower portion of said T-shaped gate structure and each of said first and second conductive source/drain structures; and
forming a second spacer adjacent said T-shaped gate structure, said second spacer comprising at least first and second air gaps within said second spacer, said first and second air gaps being positioned between at least said lower portion of said T-shaped gate structure and adjacent conductive source/drain structures.

17. The method of claim 16, wherein forming said second spacer comprises performing a conformal deposition process so as to deposit a layer of second spacer material that only partially fills spaces between said T-shaped gate structure and said first and second conductive source/drain structures.

18. The method of claim 16, further comprising forming a conductive gate contact structure that is conductively coupled to an upper surface of said T-shaped gate structure, wherein an entirety of said conductive gate contact structure is positioned vertically above an active region of said transistor device.

19. The method of claim 18, wherein, prior to forming said conductive gate contact structure, the method comprises performing a recess etching process on each of said first and second conductive source/drain structures such that they have a recessed upper surface at a location adjacent said conductive gate contact structure, said recessed upper surface being at a level that is below a level of said upper surface of said T-shaped gate structure.

20. The method of claim 16, wherein said first and second air gaps constitute a substantially continuous air space that extends around an entire perimeter of said T-shaped gate structure.

\* \* \* \* \*